United States Patent [19]

Imai et al.

[11] Patent Number: 5,442,145
[45] Date of Patent: Aug. 15, 1995

[54] INPUT/OUTPUT TERMINAL FOR ELECTRONIC CIRCUIT DEVICE

[75] Inventors: Ryuji Imai; Toshikatsu Takada, both of Nagoya, Japan

[73] Assignee: NGK Spark Plug Co., Ltd., Nagoya, Japan

[21] Appl. No.: 134,606

[22] Filed: Oct. 12, 1993

[30] Foreign Application Priority Data

Oct. 12, 1992 [JP] Japan ................... 4-298165

[51] Int. Cl.⁶ ............................................. H05K 1/00
[52] U.S. Cl. ..................... 174/267; 174/256; 174/257; 174/259; 174/260; 361/779; 439/78
[58] Field of Search ............... 174/256, 257, 259, 260, 174/267; 228/179, 180.1, 180.2; 428/901; 361/773, 779; 439/78

[56] References Cited

U.S. PATENT DOCUMENTS

| | | |
|---|---|---|
| 5,019,944 | 5/1991 | Ishii et al. . |
| 5,041,901 | 8/1991 | Kitano et al. . |
| 5,332,869 | 7/1994 | Hagiwara . |

FOREIGN PATENT DOCUMENTS

| | | |
|---|---|---|
| 1-13501 | of 0000 | Japan . |
| 60-170294 | 9/1985 | Japan . |
| 61-81659 | 4/1986 | Japan . |
| 1-8318 | 1/1989 | Japan . |
| 2-101545 | 8/1990 | Japan . |
| 2-104647 | 8/1990 | Japan . |
| 2104647 | 8/1990 | Japan . |

OTHER PUBLICATIONS

M. Terasawa et al., "A Comparison of Thin Film, Thick Film, and Co-Fired High Density Ceramic Multilayer With The Combined Technology" *The International Journal For Hybrid Microelectronics*, vol. 6, pp. 607–615, (1983).

Burger et al., "Multi-Layer Ceramics Manufacturing", IBM J. Res. Develop., vol. 27:17–18, (1983).

*Primary Examiner*—Leo P. Picard
*Assistant Examiner*—Cheryl R. Figlin
*Attorney, Agent, or Firm*—Foley & Lardner

[57] ABSTRACT

A terminal for an electric circuit device, comprises a copper core, a gold (Au) layer provided over the copper core, and a nickel (Ni) layer having the thickness of 1.5 μm or less, provided under the gold (Au) layer. In another embodiment, the core is made of an alloy containing (Ni) and covered by a metallized surface layer made of copper.

11 Claims, 2 Drawing Sheets

INPUT/OUTPUT TERMINAL FOR ELECTRONIC CIRCUIT DEVICE

BACKGROUND OF THE INVENTION

1. Field of the Invention

The present invention relates in General to an I/O (input/output) terminal for an electronic circuit device, such as an external lead or pin for an IC (integrated circuit) package, and more specifically to such a terminal lead or pin that is to be joined by gold (Au) solder to a thin-fim or thick-film metallized pad formed on a wiring base or package substrate.

2. Description of the Prior Art

A high density IC package, as disclosed in Japanese Patent Provisional Publication No. 2-101545, includes a multilayer substrate and a thin-film wiring section formed on the substrate. In some instances, the IC package further includes a sealing cap or cover made of Koval or the like and attached to the substrate. A high density IC package of a certain kind includes at the top or bottom surface of the substrate a plurality of conductive pads connected to the interior circuit and a plurality of I/O terminals such as external leads or pins made of Koval or the like and connected to the respective pads.

The multilayer substrate consists of a plurality of insulating layers made of alumina or the like ceramics, and various wiring patterns made of a high melting point metal and formed on the main surfaces of the insulating layers, respectively. Accordingly, any of the materials constituting the multilayer substrate has a good heat-resisting characteristic.

On the other hand, the thin-film wiring section consists of a plurality of thin insulating films made of an organic insulation material such as polyimide or the like, or a non-organic insulation material such as glass, crystallized glass, glass ceramics or the like, and various wiring patterns formed on the main surfaces of the thin insulating films and made of an active metal such as titanium (Ti), chromium (Cr), or the like and a metal having a high conductivity such as gold (Au), silver (Ag), copper (Cu), etc.

Such parts as the pads, the end portions of the I/O terminals, or the like to be connected with other elements, are provided at the exterior surfaces thereof with gold (Au) layers by, for example, plating in order to improve the wettability of the joining material (e.g., gold solder). Further, in order to prevent gold (Au) from melting down and being diffused into the joining material at the time of joining or in order to prevent gold (Au) from changing the color due to the diffusion of gold (Au) into the base metal, the I/O terminals are provided with a nickel (Ni) layer under the gold (Au) layer. Further, in case where the conductive pad is of the kind consisting of a gold (Au) layer formed on a metalized surface made of a high melting point metal such as tungsten (w), molybdenum (Mo), or the like, a nickel (Ni) layer is provided under the gold (Au) layer for the same reason.

In the above described high density IC package, the conductive pads are generally formed from a thin film. Further, even if the pads are formed from a thick film of a high meting point metal, there are arranged adjacent thereto thin-film wiring. Those thin films are therefore inferior in heat resistance to the material constituting the above described multilayer substrate. Accordingly, in case of joining the I/O terminals such as external leads or pins, such gold solder as a gold-tin (Au—Sn) eutectic alloy, gold-germanium (Au—Ge) eutectic alloy, gold-silicon (Au—Si) eutectic alloy, or the like having a low melting point is used as a joining material.

However, by the experiments conducted by the applicants, it was revealed that any of the non-Au components contained in the gold (Au) solder such as tin (Sn), germanium (Ge), silicon (Si), or the like, reacted with nickel (Ni) of the nickel (Ni) layer at the time of joining or in use after joining, to form at the joint a brittle intermetallic compound causative of decrease of the joining strength.

SUMMARY OF THE INVENTION

According to an aspect of the present invention, there is provided a terminal for an electrical circuit device, which comprises a metal core, a gold (Au) layer provided over said metal core, and a nickel (Ni) layer having the thickness of 1.5 $\mu$m or less, provided under the gold (Au) layer.

According to another aspect of the present invention, there is provided a terminal for an electrical circuit device, which comprises a metal core covered by a metalized surface layer, a gold (Au) layer provided over the metalized surface layer, and a nickel (Ni) layer having the thickness of 1.5 $\mu$m or less, provided under the gold (Au) layer.

According to a further aspect of the present invention, there is provided an electric circuit device which comprises an insulating substrate, an electric wiring installed in and on the insulating substrate, an external pad installed on the insulating substrate and electrically connected to the wiring, a terminal, and solder means for joining the terminal to the pad and containing gold (Au), in which the terminal has a metal core, a gold (Au) layer provided over the metal core, and a nickel (Ni) layer having the thickness of 1.5 mm or less, provided under the gold layer.

According to a further aspect of the present invention, there is provided an electric circuit device which comprises an insulating substrate, an electric wiring installed in and on the insulating substrate, an external pad installed on the insulating substrate and electrically connected to the wiring, a terminal, and solder means for joining the terminal to the pad and containing gold (Au), in which the terminal has a metal core covered by a metalized surface layer, a gold (Au) layer provided over said metalized surface layer, and a nickel (Ni) layer having the thickness of 1.5 $\mu$m or less, provided under the gold (Au) layer.

The above structures are effective for solving the above noted problem inherent in the prior devices.

It is accordingly an object of the present invention to provide a novel and improved terminal for an electric circuit device, which can assuredly attain an intended joining strength at the joint between the terminal and its associated element.

It is another object of the present invention to provide a novel and improved terminal of the above described character which can assuredly prevent color change at its soldered portion.

It is a further object of the present invention to provide an electric circuit device equipped with a terminal of the above described character.

DETAILED DESCRIPTION OF THE PREFERRED EMBODIMENTS

Embodiment 1

Figure 1:
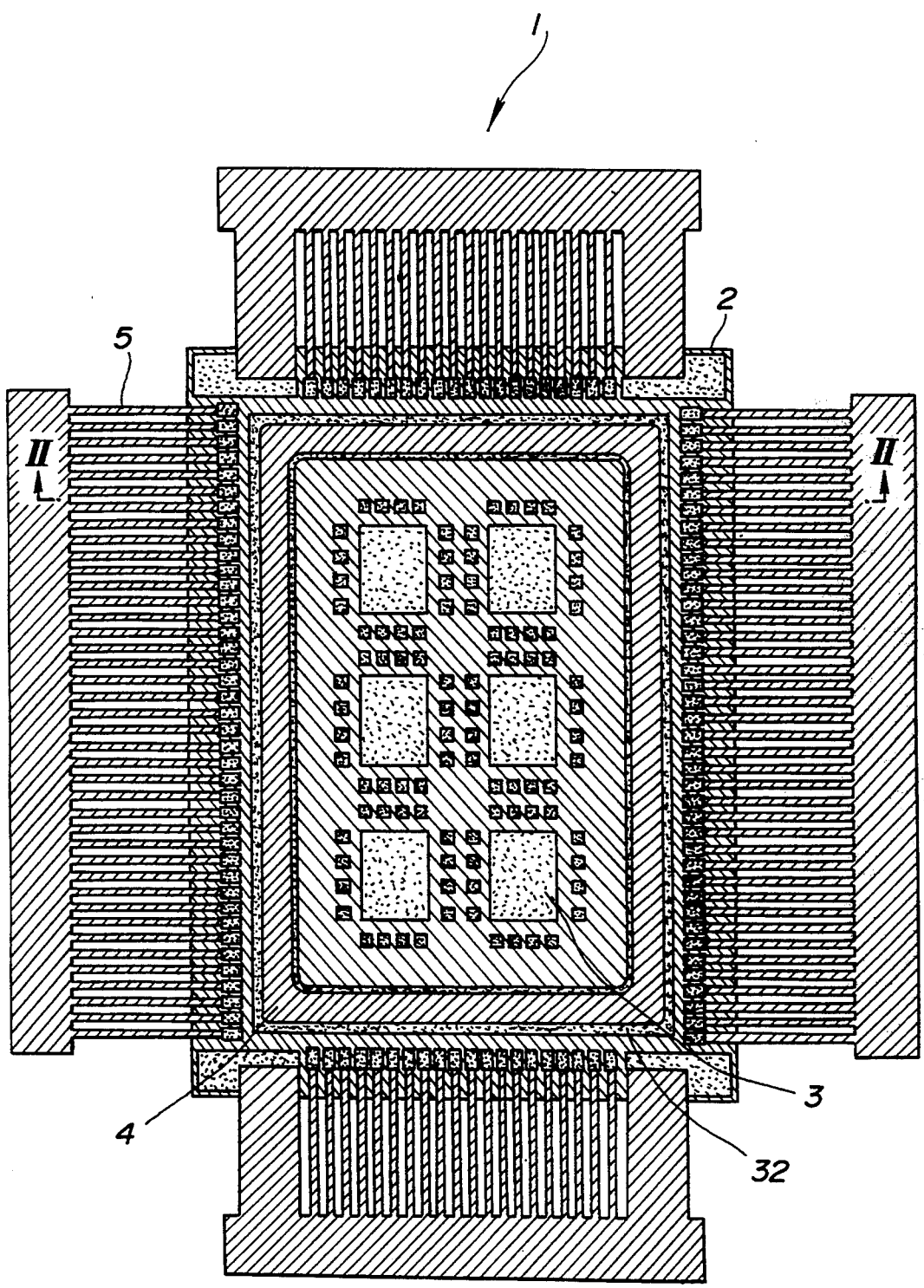
FIG. 1 is a plan view of an IC package equipped with I/O terminals embodying the present invention.
Figure 2:
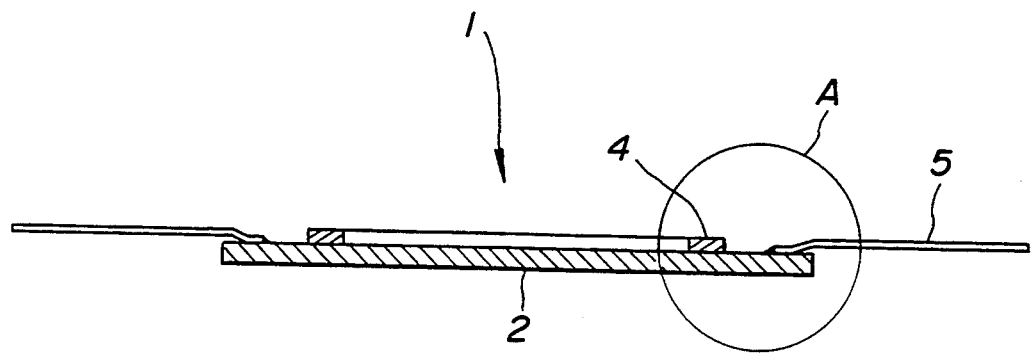
FIG. 2 is a schematic sectional view taken along the line II—II FIG. 2.
Figure 3:
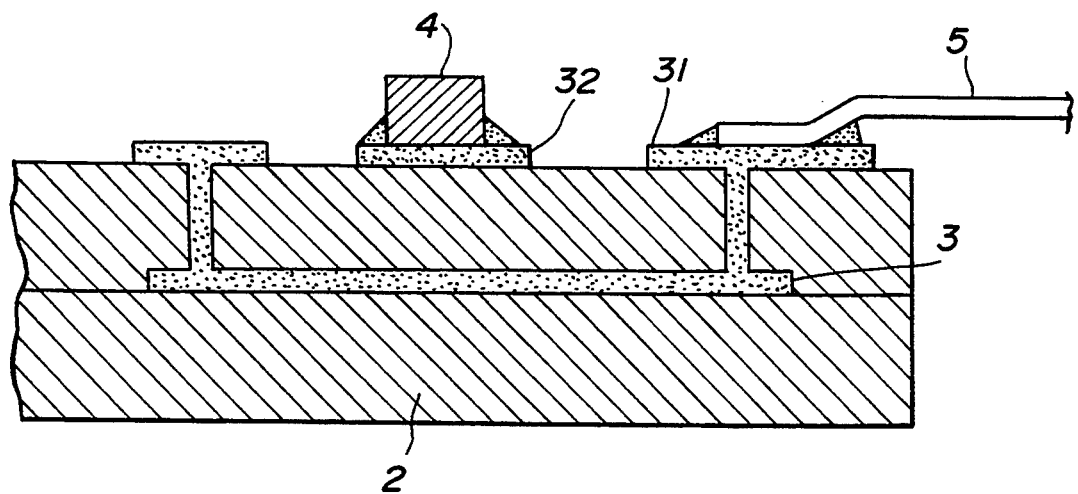
FIG. 3 is an enlarged view of a portion "A" of FIG. 2.
Figure 4:
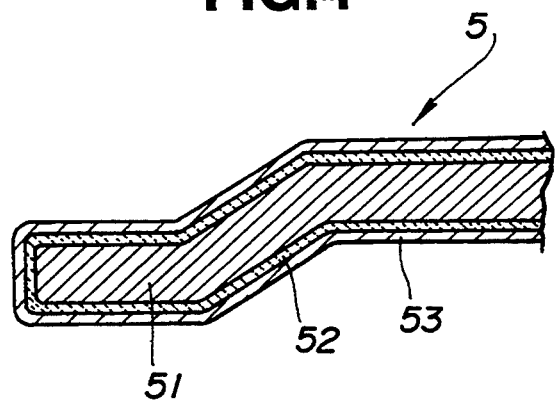
FIG. 4 is an enlarged fragmentary sectional view of one of the I/O terminals of FIG. 1.

Referring to FIGS. 1 to 4, an IC package is generally indicated by 1 and includes an insulating substrate 2 made of aluminum nitride, alumina, mullite, or the like ceramics, electric wiring 3 made of thick-films or thin-films of metal and formed in and on the isolating substrate 2, a rectangular frame-like strip 4 made of Koval and joined to predetermined portions of the wiring 3, and a plurality of external leads 5 joined to predetermined portions of the wiring 3.

The leads 5 are I/O (input and output) terminals to which the present invention is directed. The leads 5 are formed from a copper sheet of the thickness of about 0.2 mm and formed into the comblike shape as shown FIG. 1. Each lead 5 consists of a metal core 51 made of copper (Cu), and a nickel (Ni) layer 52 and a gold (Au) layer 53 formed on the exterior surface of the metal core 51. The leads 5 are joined at the free ends thereof to external pads 31 of the wiring 3.

The IC package 1 is produced as follows.

Firstly, a predetermined pattern of metallic paste such as tungsten (W) paste, Molybdenum (Mo) paste or the like paste is screen-printed on the surface of two green sheets of alumina or the like ceramics for thereby forming various wiring patterns. One of the green sheets is formed with through holes in which metallic paste is buried for electrical connection of the wiring sections on opposite sides of the sheet. The green sheets are superposed and then joined to each other by pressing and heating. Thereafter, the green sheets are fired at a high temperature of about 1500° C. for thereby producing the insulating substrate 2. The above described various wiring patterns constitute an electric wiring inside the insulating substrate 2.

Then, a side surface of the insulating substrate 2 is ground. To that ground surface, titanium (Ti) and palladium (Pd) are applied by spattering in such a manner that the thicknesses of the titanium (Ti) spatter and the palladium (Pd) spatter are 2,000 Å and 5,000 Å, respectively. Thereafter, photoresist is applied to the entire side surface of the insulating substrate 2. A photomask formed with a wiring pattern is disposed above the photoresist and exposed to light. A portion of the photoresist where a wiring pattern is to be formed, is removed by developer, and gold (Au) plating is applied thereto. Then, the remaining photoresist is removed, and an unnecessary part of the titanium (Ti) and palladium (Pd) spatter is removed by etchant, for thereby forming the exterior part of the wiring 3.

Separately, a copper sheet of the thickness of about 0.2 mm is formed into a comblike shape to constitute the metal cores 51 for the leads 5. The metal cores 51 are then plated with nickel (Ni) and gold (Au) in sequence for thereby being formed into the leads 5. Further, a frame made of Koval is prepared and similarly plated with nickel (Ni) and gold (Au) in sequence for thereby being formed into the frame-like strip 4.

Of the part of the wiring 3 located on the exterior surface of the insulating substrate 2, the peripheral portion 32 and the external pads 31 are respectively joined by gold-tin (Au—Sn) eutectic solder with the frame-like strip 4 and the leads 5, whereby the IC package 1 is completed.

The above described IC package was tested for the joining strength at the joint of the lead 5 and the pad 31. For this end, samples No. 1 to No. 5 shown in Table I were prepared. In the samples, the external pad 31 is sized to be 0.6 mm wide and 2.5 mm long, the free end portion of the lead 5 is sized to be 0.2 mm wide and 0.2 mm thick and its joining length is 1 mm, the thickness of the nickel (Ni) layer 52 is variously sized as shown in Table I (the value shown in the Table is the average of five leads), the thickness of the gold (Au) layer 53 is 2 ±0.5 μm. The test were conducted in such a manner that after joining of the lead 5 to the pad 31 the lead 5 was pulled perpendicularly to its joining surface and the load causing breakage of the joining section was measured to represent a joining strength.

Further, after joining of the lead 5 to the pad 31, the IC package was held in the atmosphere of 150° C. for 2,000 hours for observation of color change of the lead 5.

The result was also described in Table I. The joining strength in Table I results from measurement of 10 leads of each package, so it ranges from minimum to maximum as shown in Table I.

As seen from Table I, a large joining strength was obtained in case where the thickness of the nickel (Ni) layer 52 was equal to or lower than 1.5 μm. However, in the case of a sample which is not provided with a nickel (Ni) layer, the surface of the gold (Au) layer 53 of the lead 5 changed in color and took a reddish coppery color.

In the above, it is to be noted that by setting the thickness of the nickel (Ni) layer 52 at 1.5 μm or less there is not caused at the joint between the terminal 5 and the pad 31 any brittle intermetallic compound composed of nickel (Ni) and non-gold (Au) constituents such as tin (Sn), germanium (Ge) and silicon (Si). Because the nickel (Ni) layer 52 is as thin as 1.5 μm or less the non-gold (Au) constituents contained in the gold (Au) solder, such as tin (Sn), germanium (Ge) and silicon (Si) react with not only the nickel (Ni) of the nickel (Ni) layer 52 and the gold (Au) of the gold (Au) layer 53 but also with the copper (Cu) of the metal core 51 or the metallized copper (Cu) surface thereof. That is, due to the nickel (Ni) layer 52 which is as thin as 1.5 μm or less, not only the amount of the brittle intermetallic compound composed of nickel (Ni) and non-gold (Au) constituents such as tin (Sn) germanium (Ge) and silicon (Si) is small but such brittle intermetallic compound is diffused into the copper (Cu) of the core metal or the metalized surface thereof. Accordingly, the intermetallic compound is formed in strata or laminea, and peeling off of the terminal 5 does not occur along the strata or laminea of the intermetallic compound. For the above reason, an I/O terminal of the present invention can exhibit an large joining strength in joining with an associated terminal element.

In the meantime, in case where the material forming the metal core 51 is a nickel (Ni) or cobalt (Co) alloy such as Koval and 42 Ni—Fe alloy, it is necessary to form a copper (Cu) layer on the metal core 51 by metallization since the nickel (Ni) and cobalt (Co) of the metal core 51 reacts with the non-gold (Au) constituents contained in the gold (Au) solder, such as tin (Sn), germanium (Ge) and silicon (Si) to form a brittle intermetallic compound.

On the other hand, since the gold (Au) in the solder and copper (Cu) in the metal core 51 or the metallized-copper (Cu) layer thereof are easily diffused into each other, excessive diffusion may occur to cause a variation of the solder composition of the solder and therefore a variation of the melting point and the strength of the solder, resulting in a variation of the joining strength and color change of the terminal. In this connection, it is to be noted that the nickel (Ni) layer 52, though it is so thin as 1.5 mm or less, has a function of providing a shield between the gold (Au) of the gold (Au) layer (53) and the copper (Cu) of the metal core 51 or the metallized copper (cu) layer thereof for thereby preventing excessive diffusion therebetween. For the above reason, the copper (Cu) of the base metal is prevented from being excessively diffused into the solder containing gold (Au) at the time of soldering or subsequent heat treatment process, or in use at a high temperature, thus making it possible to attain a desired joining strength assuredly and prevent color change at the joining portion of the terminal.

Embodiment 2

This embodiment is substantially similar to the previous embodiment except that the material of the metal core 51 of the lead 5 is changed from copper (Cu) to Koval or Koval plated with copper (Cu). The IC package was produced under the same condition to the previous embodiment and tested for the joining strength and color change of the leads 5. The result was shown in Table II.

As seen from Table II, in case of the lead 5 having both a copper (Cu) layer and a nickel (Ni) layer of the thickness of 1.5 μm or less, it exhibited a large joining strength and did not have any color change. In contrast to this, in case of the sample No. 6 which was not provided with either of the copper (Cu) and nickel (Ni) layers and the samples No. 7 and No. 12 having the nickel (Ni) layer of the thickness beyond 1.5 μm, either of them exhibited a large joining strength. Further, the sample No. 8 which was not provided with a nickel (Ni) layer but only with a copper (Cu) layer, color change at the surface of the gold (Au) layer was observed.

From the foregoing, it will be understood that an I/O terminal of the present invention does not cause at its joining portion any brittle intermetallic compound composed of nickel (Ni) and non-gold (Au) constituents such as tin (Sn), germanium (Ge) and silicon (Si), and therefore can exhibit a large joining strength in joining with an associated terminal element.

It will be further understood that the nickel (Ni) layer functions as a shielding layer for preventing gold (Au) of the gold (Au) layer from diffusing into the metal core or the metallized surface thereof, for thereby preventing color change otherwise caused in the terminal. Accordingly, a fraction defective due to the color change can be reduced and therefore the yield rate of product can be increased.

While the present invention has been described and shown as to a lead type terminal, it is not for the purpose of limitation but can be similarly applied to a pin type terminal. Further, the present invention can produce substantially the same effect irrespective of whether the external pad is a thin-film metallized pad or a thick-film metallized pad of a high melting point metal.

TABLE I

| Sample No. | Thickness of Ni layer (Average) (μm) | Joining Strength (Kg) | Color Change |
| --- | --- | --- | --- |
| 1 | 0 | 1.5~2 | Occurred |
| 2 | 0.5 | 1.5~2 | Not Occurred |
| 3 | 1.0 | 1.5~2 | Not Occurred |
| 4 | 1.5 | 0.5~2 | Not Occurred |
| 5 | 2 or more | 0.5~1 | Not occurred |

TABLE II

| Sample No. | Thickness of Cu layer (Average) (μm) | Thickness of Ni layer (Average) (μm) | Joining Strength (Kg) | Color Change |
| --- | --- | --- | --- | --- |
| 6 | 0 | 0 | 0.2~0.5 | Not Occurred |
| 7 | 0 | 2 | 0.2~0.5 | Not Occurred |
| 8 | 2 | 0 | 1.5~2 | Occurred |
| 9 | 2 | 0.5 | 1.5~2 | Not Occurred |
| 10 | 2 | 1.0 | 1.5~2 | Not Occurred |
| 11 | 2 | 1.5 | 1~1.5 | Not Occurred |
| 12 | 2 | 2 | 0.5~1 | Not Occurred |

What is claimed is:

1. A terminal for an electrical circuit device, comprising:
    a metal core;
    a gold (Au) layer provided over said metal core; and
    a nickel (Ni) layer having the thickness of 1.5 μm or less, provided under said gold (Au) layer.

2. A terminal according to claim 1, wherein said metal core is made of copper (Cu).

3. A terminal according to claim 1, wherein said nickel (Ni) layer is formed by plating.

4. A terminal for an electrical circuit device, comprising:
    a metal core covered by a metalized surface layer;
    a gold (Au) layer provided over said metallized surface layer; and
    a nickel (Ni) layer having the thickness of 1.5 μm or less, provided under said gold (Au) layer.

5. A terminal according to claim 4, wherein said metal core is made of an alloy containing nickel (Ni), and said metallized surface layer is a copper (Cu) layer.

6. An electric circuit device comprising:
    an insulating substrate;
    electric wiring installed in and on said insulating substrate;
    an external pad installed on said insulating substrate and electrically connected to said wiring;
    a terminal; and
    solder means for joining said terminal to said pad and containing gold (Au);
    said terminal having a metal core, a gold (Au) layer provided over said metal core, and a nickel (Ni) layer having the thickness of 1.5 μm or less, provided under said gold layer.

7. A terminal according to claim 6, wherein said metal core is made of copper (Cu).

8. A terminal according to claim 6, wherein said nickel (Ni) layer is formed by plating.

9. An electric circuit device comprising:
an insulating substrate;
an electric wiring installed in and on said insulating substrate;
an external pad installed on said insulating substrate and electrically connected to said wiring;
a terminal; and
solder means for joining said terminal to said pad and containing gold (Au);
said terminal having a metal core covered by a metallized surface layer, a gold (Au) layer provided over said metallized surface layer, and a nickel (Ni) layer having the thickness of 1.5 μm or less, provided under said gold (Au) layer.

10. A terminal according to claim 9, wherein said metal core is made of an alloy containing nickel (Ni), and said metalized surface layer is a copper (Cu) layer.

11. A terminal structure comprising:
a conductive pad; and
a terminal; and
solder means for joining said terminal to said pad and containing gold (Au);
said terminal having a metal core, a gold (Au) layer provided over said metal core, and a nickel (Ni) layer having the thickness of 1.5 μm or less, provided under said gold layer.

* * * * *